(12) United States Patent
Meinders et al.

(10) Patent No.: US 8,319,174 B2
(45) Date of Patent: Nov. 27, 2012

(54) SCANNED WRITING OF AN EXPOSURE PATTERN ON A SUBSTRATE HAVING A SPOT SIZE MODULATOR AND DUAL MOTOR FOR MOVING THE SUBSTRATE TABLE AND A LASER SPOT RELATIVE TO EACH OTHER

(75) Inventors: Erwin Rinaldo Meinders, Veldhoven (NL); Peter Theodorus Maria Giesen, Geldrop (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 430 days.

(21) Appl. No.: 12/669,253

(22) PCT Filed: Jul. 15, 2008

(86) PCT No.: PCT/NL2008/050479
§ 371 (c)(1),
(2), (4) Date: Mar. 17, 2010

(87) PCT Pub. No.: WO2009/011578
PCT Pub. Date: Jan. 22, 2009

(65) Prior Publication Data
US 2010/0195073 A1    Aug. 5, 2010

(30) Foreign Application Priority Data
Jul. 16, 2007    (EP) .................................... 07112574

(51) Int. Cl.
*H01J 3/14*    (2006.01)

(52) U.S. Cl. ........................................ 250/235; 250/205
(58) Field of Classification Search .................. 250/235, 250/236, 205, 548, 559.3, 559.44; 355/53, 355/55, 67, 70, 77; 430/311, 312; 356/399–401
See application file for complete search history.

(56) References Cited

U.S. PATENT DOCUMENTS

| | | | |
|---|---|---|---|
| 6,002,466 A * | 12/1999 | Brauch et al. .................. 355/53 |
| 6,331,711 B1 | 12/2001 | Vernon | |
| 6,770,866 B2 | 8/2004 | Retschke et al. | |
| 6,833,234 B1 | 12/2004 | Bloomstein et al. | |
| 2003/0124463 A1 | 7/2003 | Sekigawa et al. | |
| 2004/0135983 A1 | 7/2004 | Wieland et al. | |

FOREIGN PATENT DOCUMENTS
EP    1 732 075 A2    12/2006
* cited by examiner

*Primary Examiner* — Que T Le
(74) *Attorney, Agent, or Firm* — Dorsey & Whitney LLP

(57) ABSTRACT

An exposure pattern is written on a substrate, by scanning a light spot along a trajectory over the substrate and switching it on and off according to a desired pattern. Respective spot sizes of the light for illuminating the substrate in respective parts of the trajectory according to a geometry of the pattern. Respective pitch values between successive ones of the parts of the trajectory are selected, in relation to the spot size selected for the respective parts. The light spot is scanned over the substrate along the trajectory, with the selected pitch values between the trajectory parts and a position dependent spot size along the trajectory. In an embodiment a helical trajectory is used.

12 Claims, 3 Drawing Sheets

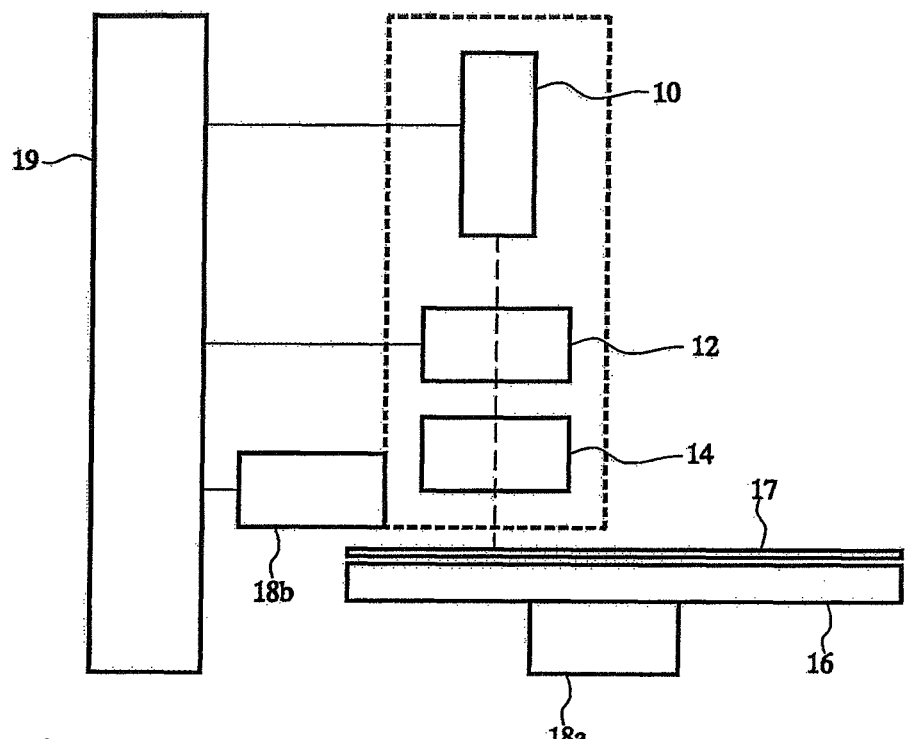
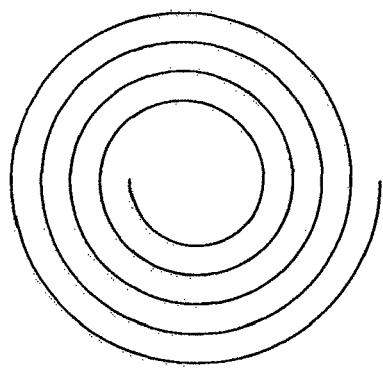
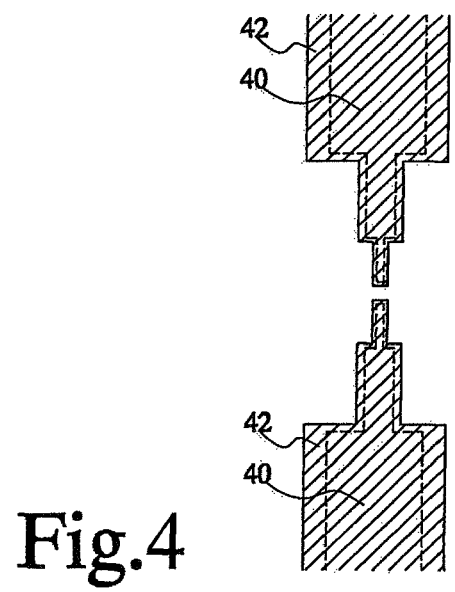
Fig.1
Fig.2    Fig.4

SCANNED WRITING OF AN EXPOSURE PATTERN ON A SUBSTRATE HAVING A SPOT SIZE MODULATOR AND DUAL MOTOR FOR MOVING THE SUBSTRATE TABLE AND A LASER SPOT RELATIVE TO EACH OTHER

CROSS-REFERENCE TO RELATED APPLICATIONS

This application is the national stage application of PCT Patent Application No. PCT/NL2008/050479, filed Jul. 15, 2008 and entitled "Scanned Writing of an Exposure Pattern on a Substrate", which claims priority under 35 U.S.C. §365 (b) to European Patent Application No. 07112574.4, filed Jul. 16, 2007 and entitled "Scanned Writing of an Exposure Pattern on a Substrate".

FIELD OF THE INVENTION

The invention relates to an apparatus and method for writing a pattern on a substrate.

BACKGROUND

U.S. Pat. No. 6,770,866 describes a direct pattern writer for creating a pattern of exposed areas on the raster lines in a photosensitive surface of a substrate, by directing a laser beam at a successive spot positions on a photosensitive surface of a substrate, scanning the spot position along raster lines and modulating the beam intensity according to the pattern. This form of writing can be used for example as a replacement for exposure through a photolithographic mask during a semi-conductor manufacturing process. However, for patterns of more than minimal complexity, the time needed to write a pattern in this way is considerably larger than needed for exposure through a photolithographic mask.

U.S. Pat. No. 6,833,234 describes a stereolithographic manufacturing technique, wherein patterns are defined in successive layers. This document proposes to write a pattern with a laser beam using a vector scan of the spot position. The document proposes to trace the contour of an exposed area with a small laser spot size and to use increasingly larger spot sizes to trace successive quasi contours at a distance to the real contour within the exposed area. Thus, the exposure time needed to realize a pattern can be reduced without sacrificing contour resolution. However, vector scanning requires a variable control scanning, which allows for mechanically difficult movements. This limits the achievable scanning speed.

SUMMARY

Among others it is an object to increase the speed with which patterns can be written using a laser pattern writer.

A method according to claim 1 is provided. Herein a light spot a variable spot size is used to write an exposure pattern to a substrate. A raster-scanning like trajectory, such as a helical scan, is used to scan a spot position over the substrate. During scanning, the scanned trajectory thus encounters parts of the exposure pattern, for example each time at the starting points of successive stripes across such a part of the exposure pattern. In the portions along the trajectory where the spot position is in parts of the pattern that need not be exposed, the spot is switched off and in other portions the spot is on, continuously or in pulses. The pitch between successive scan parts of the trajectory of the light spot on a substrate is made to vary in relation to the spot size used in the trajectory parts. A larger pitch is used for a trajectory part when a larger spot size can be used and a smaller pitch is used for a trajectory part where the spot size is smaller. In an embodiment spot sizes are selected based on a maximum allowable roughness of edges of illuminated areas of the exposure pattern at crossings between the respective parts of the trajectory and the edges. In trajectory parts where larger edge roughness is everywhere allowed a larger spot size may be selected.

In an embodiment a spiral trajectory is used, which is realized by rotating the substrate relative to the light source. This makes it possible to realize a continuous high speed of movement of the spot. The pitch between successive spiral revolutions is varied according to the spot size in the respective resolutions, using a fine pitch in spiral revolutions where a small spot size is used.

In a further embodiment the trajectory is wobbled, for example by locally decreasing or increasing the radius in part of a spiral revolution in correlation with spot size variation. This makes it possible to reduce the number of spiral revolutions that is needed to write the exposure pattern.

BRIEF DESCRIPTION OF THE DRAWING

These and other objects and advantageous aspects will become apparent from a description of examples of embodiments, using the following figures.

FIG. 1 shows a laser pattern writer
FIG. 2 shows a scan pattern
FIG. 4 shows an exposure pattern
FIG. 1 shows a laser pattern writer, comprising a laser spot generator assembly, a rotary substrate table 16, motors 18a,b and a control circuit 19. The laser spot generator assembly comprises a laser 10, a controllable diaphragm 12, and imaging optics 14. On rotary substrate table 16 a substrate 17 is shown. Laser 10, controllable diaphragm 12, imaging optics 14 and rotary substrate table 16 are mutually aligned to produce a laser spot on substrate 17, with a spot size determined by controllable diaphragm 12. A first motor 18a is coupled to rotary substrate table 16 to rotate it around a rotation axis normal to substrate 17. A second motor 18b is coupled to between rotary substrate table 16 and the assembly of laser 10, controllable diaphragm 12 and imaging optics 14 to move substrate 17 in a lateral direction, perpendicular to the rotation axis, relative to the assembly of laser 10, controllable diaphragm 12 and imaging optics 14. Second motor may be a conventional magnetically driven electromotor, such as a linear motor or any other moving mechanism including for example piezoelectric driving mechanisms. Control outputs from control circuit 19 are shown coupled to laser 10, controllable diaphragm 12 and second motor 18b. Although not shown, first motor 18a may be coupled to control circuit 19 to allow for control of rotation speed and/or detection of rotation angle, or a sensor may be provided to detect successive angle and feed detected results to control circuit 19. However, this is not needed for example when motor 18a provides for an accurately controlled time dependence of rotation angle.

Figure 3:
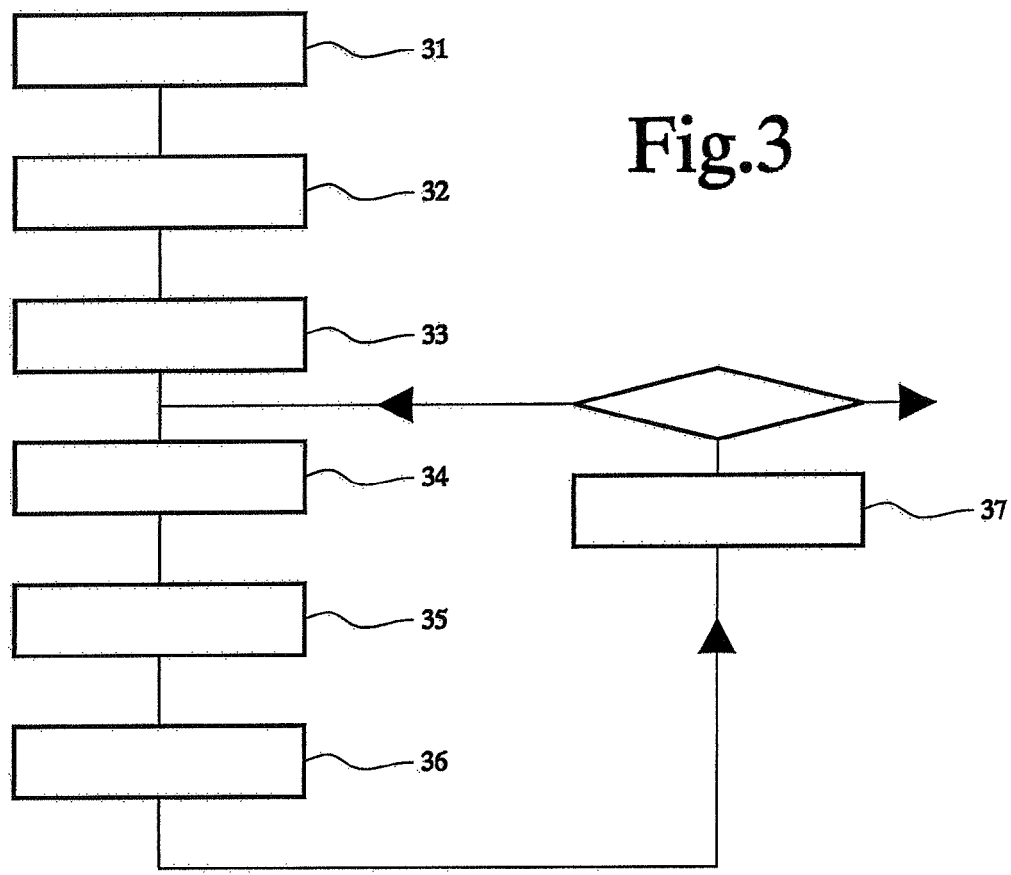
FIG. 3 shows a flow chart of pitch selection

In operation, laser 10, controllable diaphragm 12 and imaging optics 14 produce a laser spot on substrate 17. The spot is scanned over the surface of the substrate, but it is switched off in regions where the substrate need not be exposed according the required exposure pattern. During scanning control circuit 19 controls controllable diaphragm 12 to adapt the size of the spot (e.g. its diameter). In addition control circuit 19 may control laser 10 to adapt the intensity of the spot.

It should be appreciated that the use of controllable diaphragm 12 in the laser spot generator assembly is only one example of a structure that may be used as spot size modulator. Any other spot size modulator may be used, such as for example successive controllable shutters with mutually different apertures that defined different spot sizes, or adjustment of focus, so that the spot size is increased by defocusing, or by using optics that produce a spot with wavelength dependent resolution, in combination with a laser with a controllable wavelength or a diaphragm that has a wavelength dependent transparency at its edge in combination with such a laser.

FIG. 2 illustrates movement of the spot on substrate 17. First and second motor 18a,b cooperate to move the spot position on substrate 17 in a spiral pattern. First motor 18a rotates substrate 17 around the rotation axis, so that the spot position on substrate 17 moves around the rotation axis. Control circuit 19 controls second motor 18b to move the spot position radially relative to the rotation axis. The speed of radial movement determines the pitch of the spiral i.e. the distance between successive resolutions. Control circuit 19 controls the speed of second motor 18b, to vary as a function of time dependent on a pattern that has to be written.

FIG. 3 shows a flow chart of an example of a method of pitch selection, which may be executed under control of a computer executing a pitch selection program. It should be emphasized that this is only one example of many possible methods. In a first step 31 of the method the computer receives information defining a desired exposure pattern and the allowable roughness of its edges.

FIG. 4 shows an example of such an exposure pattern, indicating areas that must be exposed to the laser spot by hatching. In addition a dashed line is used to indicate the border between interior regions 40 that must be entirely exposed and edge regions 42, where it is acceptable that the areas be partly exposed due to roughness of the edges. The size of the edge region 42 depends on the application for which the substrate will be used. In specific cases, for instance at places where the highest spatial resolution is required, the edge region can be up to 1-10% of the feature size. In many cases rules may be provided for the edge regions 42 that allow automatic computation of the edge regions 42. In the example of the figure it is assumed that the width of the edge regions 42 is proportional to the width of the exposed areas, but other rules may be used as needed. If needed the edge regions 42 can be explicitly indicated by a designer.

In a second step 32 the computer determines a position of the rotation axis in the pattern, i.e. the position where the rotation axis of rotary substrate table 16 will intersect the pattern. This information defines circles or circle segments of locations with the centre at the position of intersection.

Figure 4A:
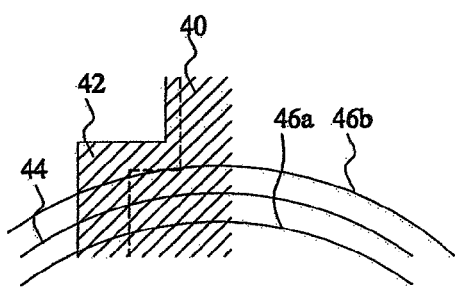
FIG. 4a shows spiral revolutions relative to an exposure pattern

FIG. 4a illustrates the exemplary method. This method selects increasingly larger spiral revolutions 46a,b around this position successively (only part of the revolutions is shown, each revolution extends over 360 degrees). It should be noted that the figure may exaggerate the pitch between successive spiral revolutions 46a,b relative to the features of the exposure areas 40, 42, for the sake of explanation. In practice a much smaller pitch may be used.

Before a next revolution 46b is selected an inner revolution contour 44 is determined, which indicates the outer boundary of a part of substrate 17 that will have been sufficiently exposed in the previously selected spiral revolutions 46a. The method determines the maximum spot size of spots that can be used to expand this inner revolution contour 44, without causing exposure outside the areas 40, 42 that must be exposed. Typically, when the inner revolution contour crosses only wide edge regions 42 of the substrate 17, this maximum spot size will be large, whereas it will be small, if any narrow edge region is crossed.

The pitch of the next spiral revolution 46b is selected such that it has the maximum radius that allows all parts of the interior regions 40 that cross the inner revolution contour 44 to be exposed with spots that have the selected maximum spot size and that are centered at the selected next spiral revolution 46b. These steps are repeated to find increasingly wider spiral revolutions.

As noted the pitch between spiral revolutions 46a,b is exaggerated in FIG. 4a. In many cases the differences between spot sizes and spot positions and pitches of successive spiral revolutions may be quite small, when the pitch is small compared to feature sizes. In this case, spot trajectories will approximate regularly spaced rows, with distances between rows that vary only slightly (after many rows). As a result the change of the pitch between successive spiral revolutions 46a,b typically reaches a significant level only after a plurality of spiral revolutions. In an embodiment each next spiral revolution 46b is selected by selecting only one pitch change parameter for the entire next spiral revolution 46b relative to the previous spiral revolution 46a. Moreover, spot sizes and spiral revolution pitches may be selected as updates relative to previous spot sizes, spot positions and pitches.

In an embodiment a limitation may be imposed that the spot size within an exposure area 40, 42 should remain substantially constant during a spiral revolution 46a,b, increasing or decreasing at most gradually or outside exposed areas. In this case the maximum spot size may be determined from the smallest size of the edge regions 42 where a spiral revolution 46a,b crosses the edge regions.

In a third step 33 the computer selects an initial inner revolution contour 44. In a fourth step 34 the computer selects a maximum spot size allowed by the design of the areas that must be exposed and the inner revolution contour 44, limited by the maximum usable spot size that can be produced by the assembly of laser 10, controllable diaphragm 12 and imaging optics 14. In a fifth step 35 the computer selects the next spiral revolution 46b, starting from the end of the previous spiral revolution 46a. In a sixth step 36 the computer selects the positions on the selected next spiral revolution 46b where illumination intensity will be switched on. At least a sufficient number of positions is selected to cover all parts of the interior regions 40 on the inside of the spiral revolution 46b that will not yet have been exposed during preceding spiral revolutions 46a.

In a seventh step 37 the computer computes the next inner revolution contour 44 from the selected spiral revolution 46b, the spot sizes and the spot positions. When the entire pattern is not yet enclosed within the inner revolution contour 44, the computer returns to fourth step 34. Otherwise the selection of the spiral revolutions is finished.

As may be noted the method of selection of spiral revolutions 46a,b described in the preceding has the effect that the maximum usable spot size during the next spiral revolution controls the pitch between spiral revolutions. Thus a larger spot size results in a large pitch and a smaller spot results in a smaller pitch. The spot size in turn depends on the width of the edge regions 42 on the substrate 17 that the spiral revolution crosses. If all edge regions 42 are wide the maximum spot size will be large, whereas it will be small if any narrow edge region 42 is crossed.

During writing the spot is kept switched off outside the areas than need to be exposed, or at least kept at such a low intensity level that no effective alteration of substrate 17 occurs. Near the edges of the exposed area the spot is switched on and off. The quality of the written pattern is reduced in exchange for reduced recording time. If a high-resolution pattern is required, the allowable edge roughness is low, which translates into small spot sizes. The allowable edge roughness may be used as an input for spot size and track pitch selection. The total recording time will accordingly be longer. If a low resolution pattern suffices, the edge roughness is sacrificed. A maximum edge roughness is used as criterion for determining the successive track pitch and spot size. The total recording time is accordingly reduced. Edge roughness can also result from overexposure of an area (meaning that the feature is locally widened). The illuminated area should remain in edge region 42.

In addition a spot intensity may be selected. In an embodiment the exposed material (such as photo-resist, phase-change material, or other recording material) may impose a minimum and/or maximum on illumination intensity. The actual illumination intensity may depend on spot intensity, spot size, spot velocity (the so-called linear velocity, i.e. the rotation velocity of substrate 16 times the radius of the spiral revolution), track pitch and laser wavelength. The illumination intensity increases with spot intensity. In principle the spot intensity may be selected so that for the actual spot size, spot velocity, track pitch and laser wavelength the required illumination intensity is realized. In addition, or alternatively, the rotation velocity of substrate table 16 may be adapted according to the spot size, to realize a desired illumination intensity.

In a number of applications the exposed material may also impose requirements on the homogeneity of the illumination pattern. In such an application adjacent written tracks on substrate 17 must have a distance and width that realizes the required homogeneity between the adjacent tracks. Combined with requirements on illumination intensity, this homogeneity requirement may translate into a constraint on the combination of spot intensity, spot size and track pitch that may be used, leaving effectively only one free parameter. In this case the fourth and fifth step 34, 35 may be combined, selecting the combination of spot size and track pitch (with implied spot intensity) with maximum spot size that ensures homogeneity in all the interior exposure areas 40 in the spiral revolution. Without such a constraint on homogeneity, track pitch may be selected in proportion to minimum spot size within a spiral revolution (i.e the maximum spot size allowed by the smallest edge region). With such a constraint, the selected spot intensity may also affect pitch.

A criterion for track-pitch, spot size and spot power selection is the amount and homogeneity of the exposure of the inner region 42 (the edge region is less demanding with respect to illumination uniformity). Preferably, a homogeneous illumination of pre-defined amount is required. The radius R0 of a Gaussian intensity profile is defined as $R0=0.52*1.22*Lambda/(2*NA)$ ($=1/e$ radius of Gauss), where lambda is the wavelength of the light and NA is the numerical aperture of the laser spot. If two identical intensity profiles are superimposed at distance R0, a uniform intensity profile results. In the case of two different spots, the spot power has to be adapted accordingly. The power scales with the surface of the spot, a five times larger spot requires a 25 times larger laser power to obtain the same power density.

In a number of applications, such as when a phase change material on substrate 17 has to be illuminated to bring it into, for instance, an amorphous state, requirements are imposed on the duration of illumination at locations on substrate 17. A pulsed laser source may be used to satisfy such requirements, the pulses being triggered only in areas that need to be exposed. When pulses are used the spot intensity may also be selected dependent on pulse duration. The pulse duration of the laser pulses may depend on the type of required image (interior region 40 and edge region 42), the recording velocity, etc. In principle, pulse positions may be selected for individual pulses, so as to realize a pattern of pulsed spots on the substrate that meets homogeneity requirements. In an embodiment the frequency of pulse firing for a trajectory part is selected dependent on spot size, the pulses being fired at this frequency along the trajectory part to realize a spots with distances in proportion to spot size for example. This makes it possible to realize near homogeneous cumulative illumination.

As emphasized in the preceding, the described method is only one example. Many alternatives and refinements are possible. For example, the spiral revolutions may be selected successively outward-in, or not successively at all by means of an optimization process that searches for an optimal combination of spiral revolutions. Furthermore, it may be desirable to impose limitations on the bandwidth of variation of the radius of the selectable spiral revolutions 46a,b, within and between spiral revolutions 46a,b, to take account of limitations of second motor 18b.

Various optimizations may be applied to maximize the pitch between successive spiral revolutions. Although the example provides for substantially the same spot size everywhere in the same spiral revolution, smaller or larger spot sizes may be used instead at different positions in the spiral revolution, as far as consistent with the pattern of exposed areas and intensity and homogeneity requirements. In this way the expansion of the inner revolution contour 44 may be maximized.

The results of any method for selection of the spiral revolutions and spot sizes (and optionally spot intensity and pulse locations) may be used in control circuit 19 to control the apparatus. In each revolution of substrate 17 control circuit 19 controls second motor 18b according to the selected spiral revolutions, to create a pitch between successive spiral revolutions 46a,b as selected. Accordingly, control circuit 19 makes the pitch vary between different spiral revolutions as a function of the rotation, with a pattern of pitch variation that has been selected dependent on the content of the pattern of areas that has to be exposed. Furthermore control circuit 19 controls controllable diaphragm 12 to set the selected spot sizes of the spots. In an embodiment control circuit 19 changes the spot size and the pitch (effected by the speed of movement generated by second motor 18b) gradually or at most once per revolution of substrate 17.

In the illustrated embodiment substrate 17 is rotated to realize the spiral track. This makes it possible to realize a high scanning speed. Alternatively, the position of the laser assembly may be rotated around a rotation axis normal to the surface of substrate 17. In another embodiment one or more movable scanning mirrors or refractive elements may be used in imaging optics 14 to rotate the position of the spot on substrate 17 around the rotation axis. In one example, the laser beam may be projected through a hole in substrate 17, reaching a mirror with a surface at an angle to the beam, which is rotated around a rotation axis through the hole and normal to the surface of the substrate 17, so that a rotating motion of the spot is realized.

Furthermore, control circuit 19 may control laser 10 to set the intensity of laser 10 according to the selected intensity of the spots. Also, control circuit 19 may control laser 10 to select pulse timing dependent on selected pulse frequency or positions.

Typically, pitch, spot size and optionally spot intensity and pulse positions will be computed before the start of processing of substrate 17. However, they may also be computed incrementally by control circuit during processing.

In an embodiment, control circuit 19 causes the radius of the spiral to increase monotonically during revolution of the substrate. This may be the case for example if each revolution has its own constant spot size. In another embodiment control circuit 19 also allows for wobbling.

Figure 5:
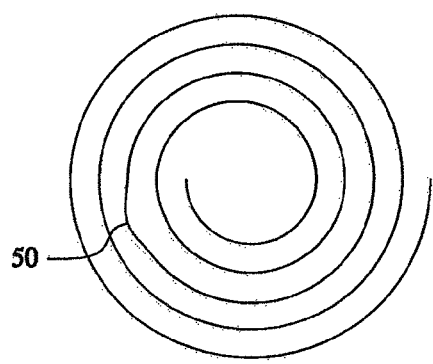
FIG. 5 shows a further scan pattern

FIG. 5 shows a scan pattern comprising an exaggerated wobble 50. In practice wobbles will be much smaller. Although one wobble is shown, it should be appreciated that the scan pattern may include a plurality of wobbles, which form a continuous wobbling pattern. Wobbling may be realized by adding a piezoelectric actuator to control rapid and small deviations of the relative position of the assembly of laser 10, controllable diaphragm 12 and imaging optics 14 with respect to substrate 17. Alternatively, wobbling may be realized by means of second motor 18b. Wobbling may be used to reduce the number of revolutions that is needed to expose a pattern of areas.

Figure 6:
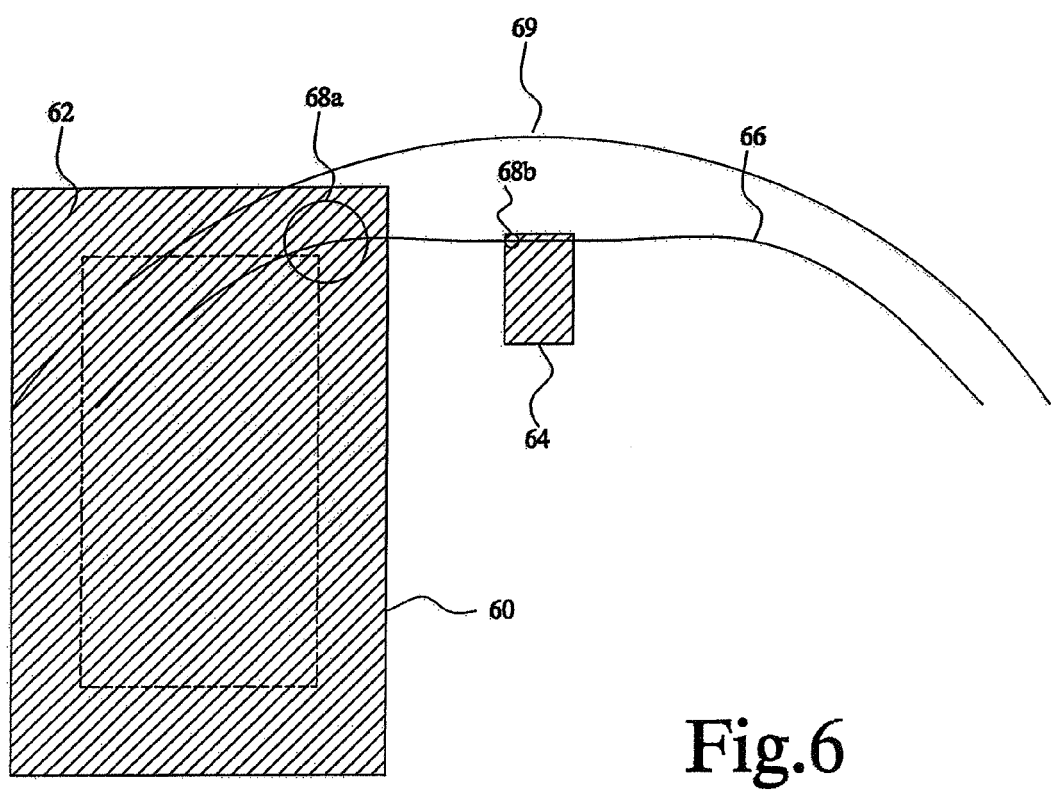
FIG. 6 shows spiral revolutions relative to an exposure pattern

FIG. 6 shows an exaggerated example where this may be used. In this example both an exposure area 60 with a large edge region 62 and an exposure area 64 with a narrow edge region cross a spiral revolution 66. An edge of the exposure area 64 with the narrow edge region lies near the spiral revolution 66. In this case a larger part of the wide exposure area 60 with the large edge region 62 may be written by locally increasing the pitch and the spot size 68a where the spiral revolution 66 crosses the wide area 60. Where the spiral revolution 66 crosses the exposure area 64 with the narrow edge region a smaller spot size 68b and pitch are used. When this is done in the last spiral revolution wherein a part of the exposure area 64 with the narrow edge region is exposed, this makes it possible to increase the pitch to the subsequent spiral revolution 69. As will be understood this involves wobbling the spiral revolution in correlation with the spot size variations, wobbling the spiral revolution to one side when a larger spot size is used (in exposure area 60) and/or wobbling the spiral revolution to the opposite side when a smaller spot size is used (in exposure area 64). This may be done in a neighborhood wherein adjacent positions in successive trajectory parts lie inside and the outside exposure area 64 respectively. Additional wobbles may be used in adjacent tracks to increase the coverage of exposure areas.

This may be applied in control circuit 19, by configuring it to control second motor 18b or an additional actuator (not shown) to wobble the spiral track within a spiral revolution, accompanied by controlling controllable diaphragm 12 to effect relatively wider and narrower spot sizes. The deflection information used for controlling second motor 18b or an additional actuator (not shown) may be generated using information that defines the exposure pattern.

Although an embodiment has been shown wherein a spiral writing pattern has been used, it should be appreciated that a Cartesian pattern may be used, comprising for example straight lines going successively back and forth across substrate 17. In this case linear motors may be used instead of first motor 18a. In this case the pitch between the straight lines may be varied dependent on the exposure pattern. Use of a spiral pattern has the advantage that it allows for much higher overall scanning speed.

As a result a trajectory with substantially pattern independent direction will be used, such as a helical trajectory with directions that are substantially perpendicular to radii from the centre of the helix. As used herein, the phrase "trajectory with directions that are substantially pattern independent" encompasses a helical trajectory and trajectories with wobbles, i.e. local deviations of a trajectory part from a regular trajectory that remain within a band between directly or indirectly adjacent trajectory parts. A trajectory with directions that are substantially pattern independent is akin to a predetermined scan pattern except that the pitch between successive substantially parallel trajectory parts and local wobbles may be pattern dependent. The spot is effectively switched on and off in portions of the trajectory where the spot position is in parts of the exposure pattern where exposure is required and not required respectively. Spots that are effectively on, as used herein, include spots that are continuously on or pulsed on, with a sufficient cumulative intensity to affect the substrate for the purpose for which the substrate is illuminated. Spots that are effectively off, as used herein, include spots that are completely switched off, and also spots that have some intensity, but which is cumulatively insufficient to affect the substrate for the purpose for which the substrate is illuminated.

A spot size variation can also be obtained by using a fixed laser spot assembly with intensity modulation to change the recorded spot size, when the recorded spot is defined as a region wherein intensity exceeds a threshold value needed for affecting changes in the substrate. A simple way to change the recorded spot size is by variation of the exposure power. In this way an oversize of the spot in the range of 10-20% may be realized. Limitations on illumination intensity or homogeneity limit this range. The illumination profile of the focused laser spot is typically Gaussian or Airy shaped. Writing with too high power will lead to overexposure of the exposed layer. A too low power implies that only the top of the focused spot is used to write the features, making the system very sensitive to noise. Ideally, the full-width half maximum of the laser spot is used to write the feature.

Use of optical spot size modulation, implemented for example by a laser spot generator assembly with a controllable diaphragm 12, has the advantage that a larger range of spot size variation may be realized. A similar effect may be realized by other spot size modulation techniques, such as focussing and defocusing of imaging optics 14. In this case no controllable diaphragm 12 is needed.

In an embodiment a pre-patterned substrate is used, for example with pre-pits or pre-grooves (typically this is a constant value, across the entire substrate 17). In this case, a plurality of grooves may be written in parallel by using a spot size that extends over a plurality of grooves. The tracking signal is derived from the light beam reflected from these tracking patterns. In this embodiment the possible track-pitch values are restricted by distances between pre-pits or pre-grooves (typically this is a constant value, across the entire substrate 17). The track pitches 46a, and 46b between exposed areas are now each time an integer multiple of unit track pitches, defined by the pre-pit or pre-groove structure. Similarly, the spot size may be set in correspondence with an integer multiple of the unit track pitches. Again, the procedure similar to that given in FIG. 3 may be used to select the integer numbers.

The exposure method can be used to make devices on a solid substrate, like glass or silicon, or on flexible substrates attached to a solid carrier, like PEN or PET foils glued on a glass or silicon carrier, or on a freestanding flexible substrate. A typical example of a device made with the proposed illumination method is based on photoresist patterning. The substrate comprises a thin layer of photoresist deposited (spin-coating, die coating, lamination, etc.) on an underlying layer. After exposure, the illuminated areas (positive resist) or unexposed areas (negative resist) are dissolved during a development process. This dissolution results in a patterned photoresist layer. The patterned photoresist layer serves as mask to pattern a functional layer (metal, semiconductor material, dielectric material, etc.). The functional layer can be deposited after photoresist patterning (lift-off process) or can be deposited prior to photoresist deposition (the photoresist layer sits on top of the functional layer and etching is used to pattern the functional layer).

In another embodiment phase transition materials may be used as mask layer for patterning a functional layer. Phase-transition materials can be transformed from the initial unwritten state to a different state via for instance, laser-induced heating or photon-induced transitions. Heating of the recording stack can, for example, cause mixing, melting, amorphisation, phase-separation, decomposition, etc. One of the two phases, the initial or the written state, dissolves faster in acids or basic (alkaline) development liquids than the other phase does.

In another embodiment, materials are used that undergo a photon-induced transition, like photon-induced degradation, cross-linking or UV curing.

In another embodiment, the system comprises multiple write spots with variable spot sizes to further reduce the recording time. Multiple spots may be generated by, for instance, using multiple laser sources (same or different wavelength) or a beamsplitter (such a semitransparent mirror, a spatial light modulator, etc.).

The invention claimed is:

1. A method of writing an exposure pattern on a substrate, wherein a light spot is scanned along a trajectory over the substrate and switched effectively on and off along the trajectory according to parts of the exposure pattern encountered in the trajectory, to assemble illumination of the substrate according to the exposure pattern, the method comprising:
providing a definition of a geometry of the exposure pattern;
selecting respective spot sizes of the light for illuminating the substrate in respective parts of the trajectory according to the geometry;
selecting respective pitch values between successive ones of the parts of the trajectory, in relation to the spot size selected for the respective parts;
scanning the light spot over the substrate along the trajectory, with the selected pitch values between the trajectory parts and a position dependent spot size along the trajectory.

2. A method according to claim 1, the method comprising rotating the substrate and a spot position relative to each other around a rotation axis normal to a surface of the substrate while the spot is scanned, the trajectory forming a spiral on the surface of the substrate, with revolutions caused by the rotation, the spot size being varied along the trajectory, the pitch between successive spiral revolutions varying with the spot size used in the spiral revolutions.

3. A method according to claim 1, comprising wobbling the trajectory and varying the spot size in correlation with said wobbling.

4. A method according to claim 1, wherein the spot sizes are selected based on a maximum allowable roughness of edges of illuminated areas of the exposure pattern at crossings between the respective parts of the trajectory and the edges.

5. A method according to claim 4, wherein a constant spot size is selected along a trajectory part between the crossings of at least one of the parts of the trajectory and the edges of at least one of the illuminated areas.

6. A method according to claim 1, wherein a maximal spot size is used that is compatible with maximum roughness requirements for the exposure pattern and limitations on spot size modulation, to trade off roughness for writing speed.

7. A laser pattern writer, comprising
a substrate table for holding a substrate;
a laser spot generator assembly configured to project a spot onto a spot position on the substrate, the laser spot generator comprising a spot size modulator;
a first motor configured to move the table and the spot relative to each other according to a predetermined movement pattern;
a second motor configured to move the table and the spot relative to each other transverse to movement along the predetermined movement pattern, creating a trajectory of the spot on the substrate with a pitch between successive parts of the trajectory determined by the second motor;
a control circuit having outputs coupled to control inputs of the spot size modulator and the second motor, and configured to switch the spot effectively on and off along the trajectory according to the exposure pattern and to cause the spot size modulator and the second motor to vary the spot size and the pitch along the trajectory, increasing the pitch when the spot size is increased, dependent on a pattern of areas that has to be exposed to illumination from the laser spot generator.

8. A laser pattern writer according to claim 7, wherein the first motor is configured to rotate the substrate and a spot position relative to each other around a rotation axis normal to a writable surface of the substrate, the trajectory being a spiral, with revolutions caused by the rotation, the spot size being varied along the trajectory, the pitch between successive spiral revolutions varying with the spot size used in the trajectory parts.

9. A laser pattern writer according to claim 7, wherein the control circuit is configured cause the trajectory to wobble and to vary the spot size in correlation with said wobbling.

10. A laser pattern writer according to claim 7, wherein the spot size modulator comprises a controllable diaphragm.

11. A laser pattern writer according to claim 7, wherein the spot size modulator comprises imaging optics with a controllable focus, the spot size being controlled at least partly by defocussing of the spot.

12. A laser pattern writer according to claim 7, wherein the spot size modulator comprises a laser intensity controller, the spot size being controlled at least partly by varying an intensity of the spot.

* * * * *